(12) United States Patent
Kim et al.

(10) Patent No.: US 8,796,698 B2
(45) Date of Patent: Aug. 5, 2014

(54) METHOD FOR FABRICATING SUBSTRATE WITH NANO STRUCTURES, LIGHT EMITTING DEVICE AND MANUFACTURING METHOD THEREOF

(75) Inventors: Jong Wook Kim, Seongnam-si (KR); Hyun Kyong Cho, Seoul (KR)

(73) Assignees: LG Electronics Inc., Seoul (KR); LG Innotek Co., Ltd., Seoul (KR)

( * ) Notice: Subject to any disclaimer, the term of this patent is extended or adjusted under 35 U.S.C. 154(b) by 666 days.

(21) Appl. No.: 11/638,406

(22) Filed: Dec. 14, 2006

(65) Prior Publication Data

US 2007/0166862 A1    Jul. 19, 2007

(30) Foreign Application Priority Data

Dec. 15, 2005    (KR) .......................... 10-2005-0123861

(51) Int. Cl.
  *H01L 21/00*    (2006.01)
  *H01L 33/00*    (2010.01)

(52) U.S. Cl.
  USPC ....................... 257/79; 257/676; 257/E25.032

(58) Field of Classification Search
  USPC ..................................... 257/79, 676, E25.032
  See application file for complete search history.

(56) References Cited

U.S. PATENT DOCUMENTS

| 6,518,194 B2 | 2/2003 | Winningham et al. | |
| 2004/0217362 A1* | 11/2004 | Slater et al. | 257/79 |
| 2005/0199895 A1* | 9/2005 | Seong et al. | 257/94 |
| 2007/0085102 A1* | 4/2007 | Orita | 257/98 |

FOREIGN PATENT DOCUMENTS

| CN | 1610135 A | 4/2005 |
| JP | 2005-064492 A | 3/2005 |
| KR | 10-2005-0062280 A | 6/2005 |
| WO | WO 2005/007564 | 1/2005 |

* cited by examiner

*Primary Examiner* — Cathy N Lam
(74) *Attorney, Agent, or Firm* — McKenna Long & Aldridge LLP

(57) ABSTRACT

A method of fabricating a substrate with nano structures, light emitting device using the substrate and a manufacturing method thereof, wherein a substrate for growing a light emitting device is formed with nano agglomerations, and the substrate is etched by using the agglomerations as a mask to allow nano structures to be formed on the substrate, thereby enabling to grow a crystal defect-reduced, reliability-improved, good quality light emitting structure, and wherein the light emitting structure is formed with nano structures to enhance the light extraction efficiency.

19 Claims, 8 Drawing Sheets

METHOD FOR FABRICATING SUBSTRATE WITH NANO STRUCTURES, LIGHT EMITTING DEVICE AND MANUFACTURING METHOD THEREOF

The present invention claims the benefit of Korean Patent Application No. 10-2005-0123861 filed on Dec. 15, 2005, in the Korean Intellectual Property Office, the disclosure of which is incorporated herein by reference.

BACKGROUND

The present invention relates to a method for fabricating a substrate with nano structures, a light emitting device and a manufacturing method thereof.

A typical Light Emitting Diode (LED) is a single wave light source applied to various products, such as, but not limited thereto, backlights, signal lights, general illumination purposes and full color displays. Gallium nitride (GaN)-based and ZnO-based materials have a wide energy band gap of direct transition type, and many researches and developments thereto are being performed and commercialized recently as light sources of ultraviolet (UV), blue and green wavelength ranges.

Meanwhile, light generated from within the LED is discharged outside of the LED, but unfortunately, some of the light generated from inside of the LED is trapped within the LED by reflection from an interface between the two materials such as the LED and air beyond a critical angle. In other words, light that reaches the surface beyond the critical angle will not cross but will experience a total internal reflection (TIR).

In other words, the conventionally-structured LED suffers from a drawback of degraded light extraction efficiency, and many attempts have been made to improve this drawback.

The light being trapped within the LED is explained by Snell's Law defined by an Equation of $n_1 *\sin \theta_1 = n_2 *\sin \theta_2$, that occurs in between a first material (10) and a second material (20) as illustrated in FIG. 1, where $n_1$ is an index of refraction for the first material while $n_2$ is an index of refraction for the second material, and $\theta 1$ is an incident angle while $\theta 2$ is a refraction angle.

According to the Equation of Snell's law, light incident at an angle smaller than a critical angle at an interface between the first and second materials (10, 20) passes and is discharged outside of the LED, but light having an angle larger than the critical angle is totally reflected into the LED from the interface between the two materials and trapped inside the LED and experiences the TIR.

There are several methods for improving the light extraction efficiency, some of which are explained as below.

In one approach to improving the light extraction efficiency, LED chips are ground into hemispherical shapes. In other words, a light emitting surface of the light emitting device is shaped into a hemisphere with an emitting layer at the center. Light emitted from a point in the active region of a hemispherically shaped light emitting device intersects the hemispherical interface at near normal incidence. Thus, total internal reflection is reduced. However, this technique, although it is one of the best optical choices, is tedious and wasteful of material.

In addition, defects introduced during the grinding process may compromise the reliability and performance of the light emitting devices.

In another approach, light emitting devices are encapsulated (encased) in a material with a dome or hemispherically shaped surface, although it is very difficult to manufacture.

In a different approach, a light emitting device having a micro cavity structure or a resonant cavity structure is disclosed. But this approach requires a very precise controllability and reproducibility relative to thickness of the structural layers during the fabrication process, and if the light is to be effectively extracted from semiconductors to air, this approach has a shortcoming in that the emitting wavelengths of the light emitting device should accurately match the fabricated cavity mode. Another shortcoming is that the emitting wavelengths of the light emitting device vary to drastically reduce the light extraction if temperatures or operating currents increase.

Recently, as a means to reduce TIR and improve overall light extraction, one of the more popular approach is developed which is a surface texturing. The surface texturing technique is to roughen a surface of a light emitting device chip from which light generated thereinside is artificially emitted or to include a periodic pattern of the emitting surface. The surface texturing technique is actually applied in manufacturing the LEDs.

Furthermore, a still another approach developed and applied for actual use is that patterns such as stripes, circles and lens are formed on a growth surface of a growth substrate like a sapphire before growing a light emitting structure for LEDs, and growth is performed of the LED structure, to minimize lattice defects of the grown light emitting structure and to enhance the quality, by which the light extraction efficiency of the LEDs can be improved.

The approaches of the surface roughness and patterned substrate techniques known to enhance the light extracting efficiency from the light emitting device chip may be used individually, or applied in association with the known techniques such as the chip shape-changed technique and the epoxy encapsulation to improve the light extraction efficiency to a great extent.

Meanwhile, the surface texturing and patterned substrate techniques are typically embodied by photolithography in which a photoresist (PR) pattern is formed on an insulating layer by exposure using a mask and development, dry etching or wet etching process.

Although substrates formed with micrometer accuracy patterns are currently developed and applied to products, the trend is that embodiment and development of nanometer accuracy patterns are required in order to enhance the light extraction efficiency.

In order to embody the nanometer accuracy patterns, accurate lithography techniques such as E-beam lithography, laser hologram and deep UV stepper are typically employed, but there are shortcomings of poor manufacture yield, high system cost and poor mass productivity. As a result, a manufacturing technique of nanometer scale accuracy is required for easy implementation, good manufacture yield and price competitiveness during manufacturing.

SUMMARY

It is an object of the present invention to provide a method of fabricating a substrate with nano structures, a light emitting device and a manufacturing method thereof, whereby a substrate for growing a light emitting device (LED) is formed with nano agglomerations, the substrate is etched by using the agglomerations as a mask to allow nano structures to be formed on the substrate, thereby enabling to grow a crystal defect-less, reliability-improved, good quality light emitting structure, and wherein the light emitting structure is formed with nano structures to enhance the light extraction efficiency.

It is another object of the present invention to provide a method of fabricating a substrate with nano structures, a light emitting device and a manufacturing method thereof, whereby nano agglomerations are formed using a simple thermal treatment process and a substrate is etched by using the agglomerations as a mask, thereby enabling to form nano structures on the substrate with ease and less cost.

In one general aspect, a method of fabricating a substrate with nano structures comprises: forming a protective film on the substrate and forming a thin film layer including a metal on the protective film; performing a thermal treatment process on the thin film including the metal and forming a plurality of nano agglomerations on the protective film; etching the protective film by using the plurality of agglomerations as a mask; removing the plurality of agglomerations and forming a plurality of nano structures on the substrate by etching a top surface of the substrate using the etched protective film as a mask; and removing the protective film.

In another general aspect, a method of fabricating a light emitting device comprises: forming a plurality of nano structures on a substrate; forming on the plurality of nano structures a light emitting structure comprised of a first semiconductor layer having a first polarity, an active layer and a second semiconductor layer having a polarity that is opposite to that of the first semiconductor; forming a support on the light emitting structure; removing the substrate from the light emitting structure; and removing the support, forming a first electrode on a bottom surface of the first semiconductor of the light emitting structure and forming a second electrode on the second semiconductor.

In still another general aspect, a light emitting device comprises: a first semiconductor layer formed at a bottom surface thereof with a plurality of nano structures and having a first polarity; an active layer formed on a top surface of the first semiconductor layer; a second semiconductor layer formed on a top surface of the active layer and having a polarity that is opposite to the first polarity; a first electrode formed on a bottom surface of the first semiconductor layer; and a second electrode formed on a top surface of the second semiconductor layer.

DETAILED DESCRIPTION

Hereinafter, preferred embodiments will be described in detail with reference to the accompanying drawings.

Figure 1:
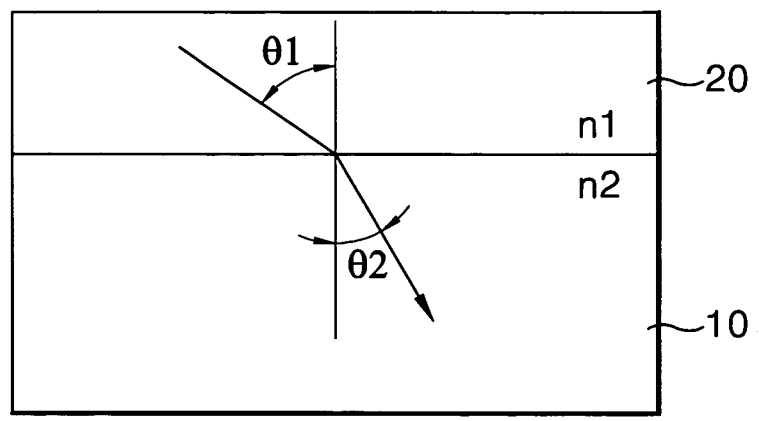
FIG. 1 is a schematic view illustrating light refracting at an interface between two different materials according to the prior art.
Figure 2:
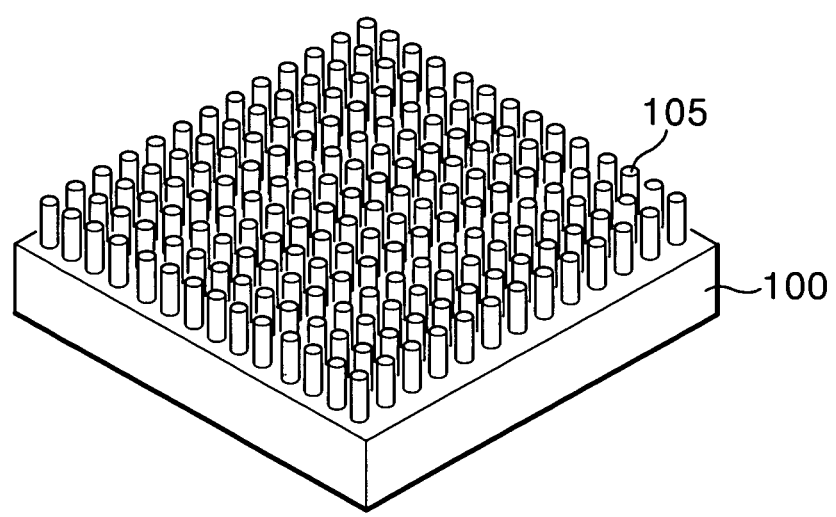
FIG. 2 is a schematic perspective view illustrating an exemplary embodiment of a substrate formed with nano structures manufactured according to the present invention.

FIG. 2 is a schematic perspective view illustrating an exemplary embodiment of a substrate formed with nano structures manufactured according to the present invention, where a substrate (100) is formed at a top surface thereof with a plurality of nano rods (105), and where the plurality of nano rods (105) comprises nano structures.

Size of each of the nano rods (105) is 10 nm~2000 nm, and although nano rods are regularly depicted in FIG. 2, the nano rods may be irregularly arranged.

Figure 3:
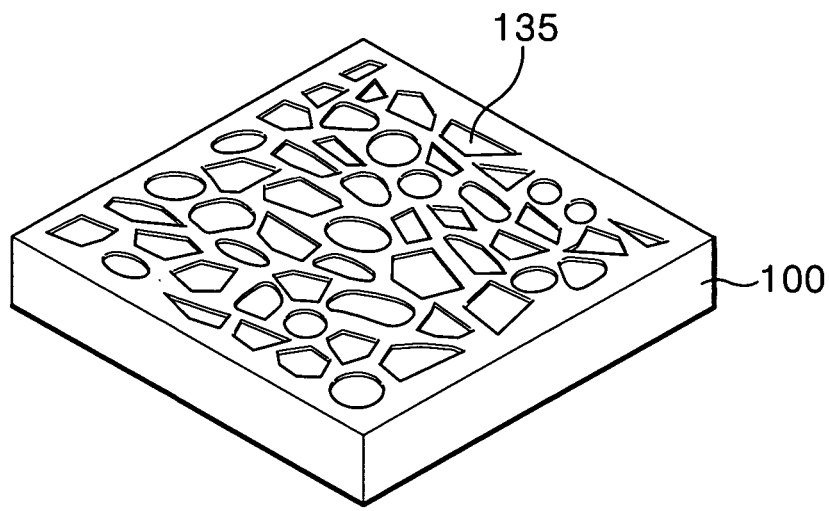
FIG. 3 is a schematic perspective view illustrating another exemplary embodiment of a substrate formed with nano structures manufactured according to the present invention.

FIG. 3 is a schematic perspective view illustrating another exemplary embodiment of a substrate formed with nano structures manufactured according to the present invention, where a substrate (100) is formed at a top surface thereof with a plurality of grooves (135), and where the plurality of grooves (135) are also nano structures.

Figure 4A:
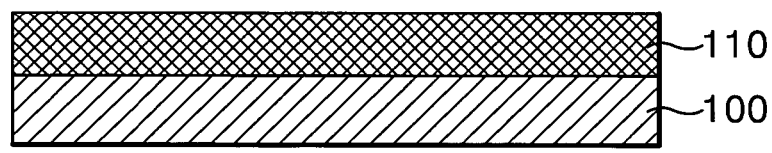
FIGS. 4a to 4g are cross-sectional views illustrating a fabricating method of a substrate formed with nano structures according to the present invention.

FIGS. 4a to 4g are cross-sectional views illustrating a fabricating method of a substrate formed with nano structures according to the present invention, where a substrate (100) is formed at a top surface thereof with a protective film (110) as shown in FIG. 4a, and where the substrate (100) is preferred to be a sapphire substrate. Preferably, the protective film (110) is $SiO_2$ or SiN which is a material easy for pattern forming by dry or wet etching, and easy for removal in a process that follow.

Figure 4B:
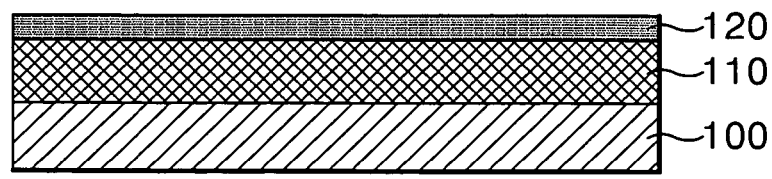

Meanwhile, thickness of the protective film (110) deposited on the substrate (100) is preferred to be 300 nm. Successively, the protective film (110) is formed at a top surface thereof with a thin film layer (120) including a metal (FIG. 4b). At this time, the thin film layer (120) including the metal may be not only the one including a very small quantity of metal but also the one including the metal only.

Preferably, the thin film layer (120) including the metal is formed with a metal having a thickness of several nm to several tens of nm by an E-Beam evaporation method. The protective film (110) not only blocks the thin film layer (120) including the evaporated metal from being diffused to or reacted with the substrate (100), but serves to control each size of agglomerations manufactured during a thermal process to a nano size.

Figure 4C:
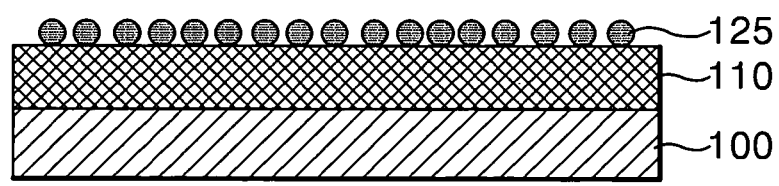

Referring to FIG. 4c, the thin film layer including the metal is successively thermally processed to allow forming a plurality of agglomerations (125), each of nano size, on the protective film (110). At this time, it is preferred that the thermal process of the thin film layer including the metal be implemented in the range of 100° C. to 2,000° C. by a Rapid Thermal Process equipment such as a Rapid Thermal Processing apparatus or a furnace.

Meanwhile, each size of the agglomerations (125) may be controlled by thickness of the thin film layer including the metal, temperature during the thermal process or thickness of the protective film. Preferably, each width of the plurality of agglomerations (125) formed on the top surface of the protective film (110) be controlled within the range of 10 nm to 2,000 nm.

The plurality of agglomerations (125) may be irregularly formed on the protective film (110), i.e., agglomerated in one lump or in several lumps, each being attached. Therefore, each size and discrete distance therebetween need not be regularly formed with a predetermined numerical value.

Figure 4D:
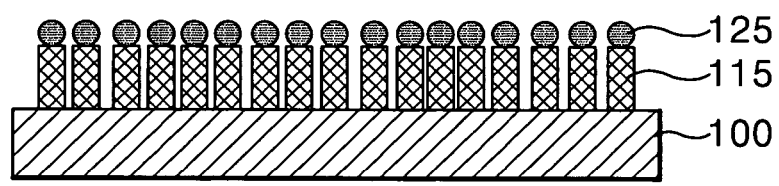

Successively, the protective film (110) is etched utilizing the plurality of agglomerations (125) as a mask (FIG. 4d). It is preferred that the protective film (110) be etched by performing a Reactive Ion Etching (RIE) process. It is apparent that the protective film (110) may be etched by various other dry etching processes than the RIE etching process.

Figure 4E:
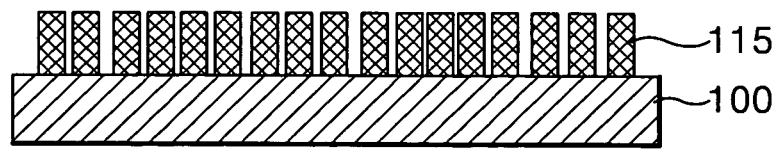
Figure 4F:
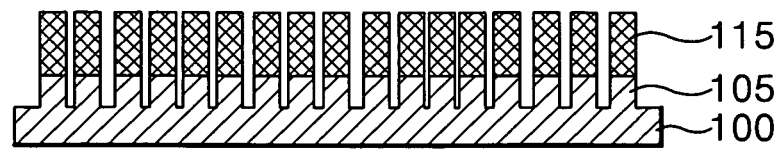
Figure 4G:
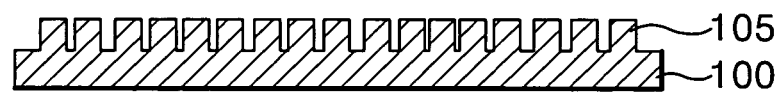

In other words, there is an advantage in the etching process according to the manufacturing method thus described in that it is easy and a high yield can be obtained with less manufacturing cost, compared with those methods embodying nanometer unit size such as lithography technologies including the conventional photolithography, E-beam Lithography, laser hologram, Deep UV Stepper. The plurality of agglomerations (125) is then removed (FIG. 4e). The plurality of agglomerations may be removed by dry or wet etching process. Thereafter, the top surface of the substrate (100) is etched utilizing the etched protective film (115) as a mask to form a plurality of nano rods (105) on the top surface of the substrate (100) (FIG. 4f).

At this time, each width of the plurality of nano rods (105) formed on the substrate (100) is controlled within the range of 10 nm to 2,000 nm as that of the agglomerations. Likewise, the substrate (100) may be etched by RIE method or other dry etching methods.

Meanwhile, as it is advantageous to refraction and reflection of light to lengthen the plurality of nano rods (105) formed by etching the top surface of the substrate (100), the deeper the substrate is, the more effective the refraction and reflection of light are.

However, it is preferred that the depth of the substrate (100) be appropriately adjusted and etched not to affect the supporting force of the substrate. Lastly, the protective film (115) is removed (FIG. 4g), which caps off the manufacturing of a substrate formed with the plurality of nano rods which is one kind of nano structures.

In the above-mentioned processes, if an agglomerated state of the agglomerations is controlled, a structure of nano grooves (not nano rods), or a mixture of nano rods with nano grooves may be formed on the substrate. In other words, if the agglomerations are so formed as to allow some portions thereof to be attached to other portions, there are formed spaces at portions of the agglomeration not attached, and the substrate exposed to the spaces may be etched to form a plurality of grooves thereon.

Thus, growth of a light emitting device epilayer on a substrate formed with nano structures such as nano rods and nano grooves has an advantage in that a crystal defect can be reduced and a high quality light emitting device can be embodied having an improved inner quantum efficiency and reliability. There is another advantage in that refraction and reflection from a substrate can be enhanced to thereby increase the light extraction efficiency and light output.

While the above exemplary embodiment according to the present invention has only described a manufacturing method of a substrate formed with nano structures in which a protective film is formed on a substrate, a thin film layer including a metal is formed on the protective film, and a thermal process is then conducted to form nano agglomerations, a substrate formed with nano structures may be manufactured in a reverse order from the above exemplary embodiment in which a thermal process is first performed to form nano agglomerations by way of forming a thin film layer including a metal, and the agglomerations thus formed are utilized as a mask.

Figure 5:
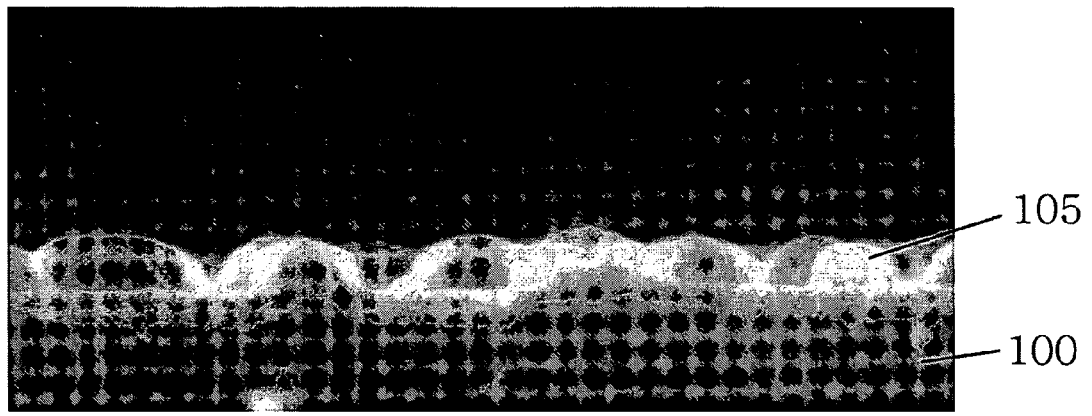
FIG. 5 is an exemplary SEM (Scanning Electron Microscope) graph of a substrate formed with nano structures according to the present invention.

FIG. 5 is an exemplary SEM (Scanning Electron Microscope) graph of a substrate formed with nano structures according to the present invention, where the substrate (100) is formed at a top surface thereof with nano rods (105), and where the substrate (100) is preferred to be a sapphire substrate.

Figure 6:
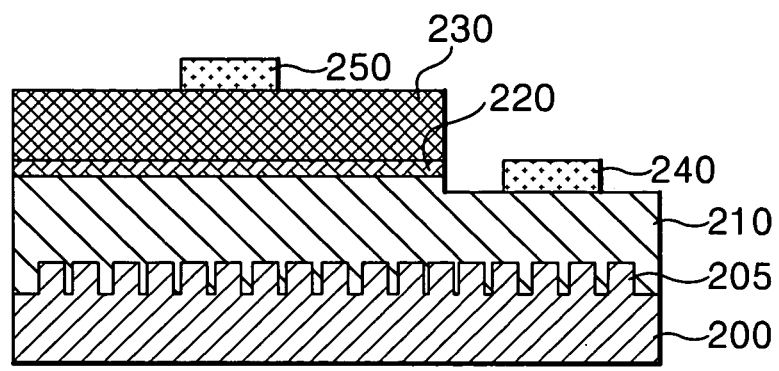
FIG. 6 is a cross-sectional view illustrating an embodiment of a light emitting device using a substrate formed with nano structures according to the present invention.

FIG. 6 is a cross-sectional view illustrating an embodiment of a light emitting device using a substrate formed with nano structures according to the present invention, in which a substrate formed with nano structures is employed to form a horizontal light emitting device with an electrode disposed at a top surface thereof.

The light emitting device is a light emitting structure comprising: a substrate formed thereon with a plurality of nano structures; a first semiconductor layer formed on the substrate and having a first polarity; an active layer; and a second semiconductor layer having a polarity opposite to the first polarity, where the first polarity is preferably n-type.

The light emitting structure comprises: an n-type semiconductor layer formed on the substrate and etched at an upper partial portion thereof at a predetermined depth; an active layer formed at a remaining portion except the etched upper partial portion of the n-type semiconductor; and a p-type semiconductor layer formed on the active layer, where the n-type and p-type semiconductors are preferably GaN (gallium nitride) semiconductor layers.

Referring further to FIG. 6, the light emitting device comprises: a substrate (200) formed thereon with nano rods (205); an n-type GaN layer (210) formed on the substrate (200) and an upper part thereof being partially removed; an active layer (220) formed on an un-removed n-type GaN layer; a p-type GaN layer (230) formed on the active layer (220); a first electrode (240) formed on removed n-type GaN layer (210); and a second electrode (250) formed on the p-type GaN layer (230), where the n-type GaN layer (210) is formed thereunder with a plurality of nano rod-shaped grooves, each width of which is preferably in the range of 10 nm~2,000 nm.

FIGS. 7a to 7e are cross-sectional views illustrating a method for fabricating a light emitting device according to the present invention, where a method for manufacturing a vertical light emitting device capable of forming nano structures on a light emitting structure using a substrate formed with nano structures will be described.

In other words, the light emitting device is formed with nano structures on a top surface of a second semiconductor layer or a bottom surface of a first semiconductor layer of a light emitting structure comprising: a first semiconductor layer having a first polarity; an active layer; and a second semiconductor layer having a polarity opposite to the first polarity, thereby enabling to enhance light extraction efficiency.

To be more specific, the plurality of nano structures are first formed on the substrate (300) (FIG. 7a), where the nano structures are nano rods (305), and the plurality of nano structures are formed in the same methods as those described in FIGS. 4a to 4g.

Figure 7A:
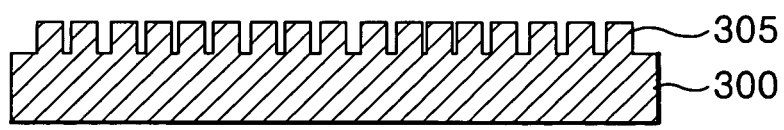
FIGS. 7a to 7e are cross-sectional views illustrating a method for fabricating a light emitting device according to the present invention.
Figure 7B:
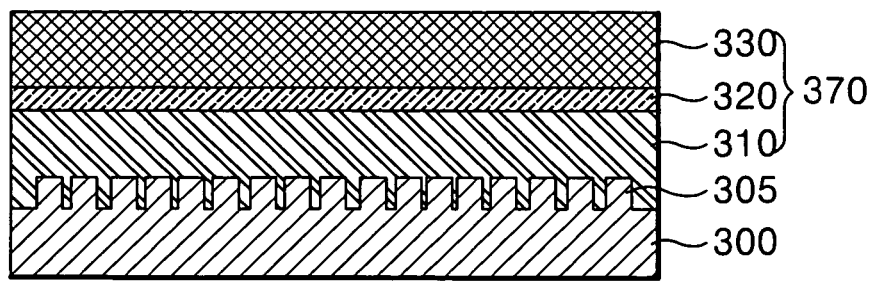
Figure 7C:
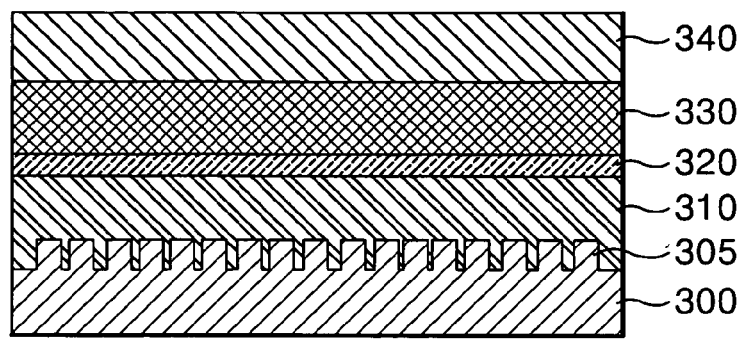
Figure 7D:
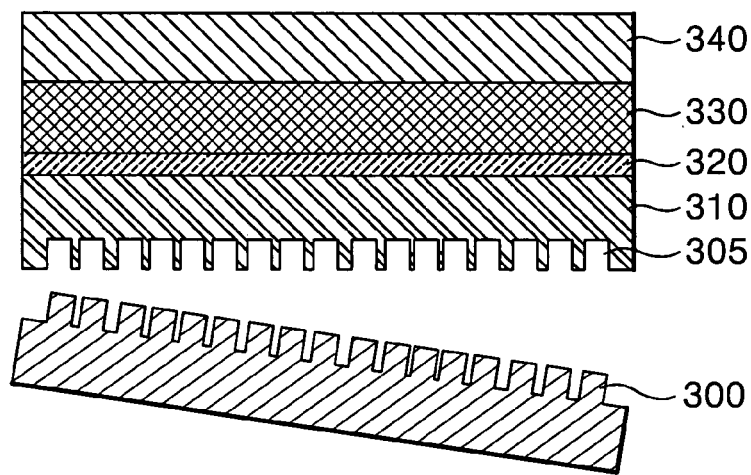

Successively, the substrate (300) disposed with a plurality of nano structures is formed thereon with a light emitting device (370), comprising: a first semiconductor layer (310) having a first polarity, an active layer (320); and a second semiconductor layer (330) having a polarity opposite to the first polarity (FIG. 7b). Then, a support (340) is formed on the light emitting structure (370) (FIG. 7c). The support (340) is so formed as to support the light emitting structure (370) when the substrate (300) is to be separated in a subsequent process.

The substrate (300) is then separated from the light emitting structure (370). The separation of the substrate (300) is performed by the conventional LLO (Laser Lift-Off) process.

Figure 7E:
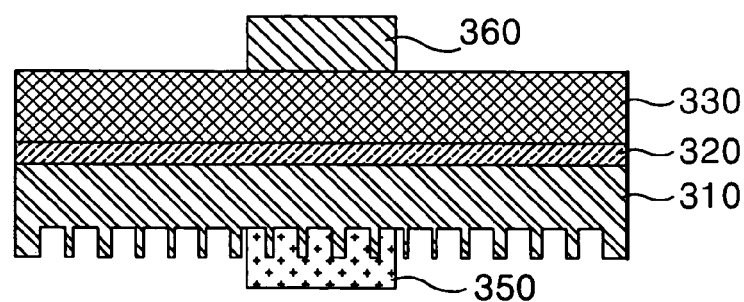

Lastly, the support (340) is removed, and a first electrode (350) is formed under the first semiconductor layer (310) of the light emitting structure (370), and a second electrode (360) is formed on the second semiconductor layer (360) (FIG. 7e).

The completion of the above processes caps the manufacturing of the vertical light emitting device, and the first semiconductor layer (310) is formed thereunder with nano structures to thereby enhance the light extraction efficiency and the light output.

Furthermore, the vertical type light emitting device comprises: a first semiconductor layer (310) formed at a bottom surface thereof with a plurality of nano structures and having a first polarity; an active layer (320) formed on a top surface of the first semiconductor layer (310); a second semiconductor layer (330) formed on a top surface of the active layer (320) and having a polarity that is opposite to the first polarity; a first electrode (350) formed on a bottom surface of the first semiconductor layer (310); and a second electrode (360) formed on a top surface of the second semiconductor layer (330).

At this time, the first electrode (350) may be formed at a part or at an entire area of a bottom surface of the first semiconductor layer (310), and likewise, the second electrode (360) may also be formed at a part or at an entire area of a top surface of the second semiconductor layer (330).

These electrodes may be freely changed in designs thereof in order to further enhance the light characteristics of the light emitting devices.

Furthermore, the electrodes enter into a basic role for supplying holes and electrons to the active layer, and an additional layer may be interposed between the first electrode (350) and the first semiconductor layer (310), or between the second electrode (360) and the second semiconductor layer (330) for enhancing the characteristics of the light emitting device.

For example, the second electrode may be composed of a reflection ohmic electrode and a metal layer, where the reflection ohmic electrode may be formed on the top surface of the second semiconductor layer (330).

If the reflection ohmic electrode is formed at an entire area of the top surface of the second semiconductor layer (330), light advancing toward the top surface of the second semiconductor layer (330) in the vertical light emitting device is reflected from the reflection ohmic electrode to be discharged to the bottom surface of the first semiconductor layer (310), such that most of the light generated from the active layer (320) is discharged to the bottom surface of the first semiconductor layer (310).

Figure 8:
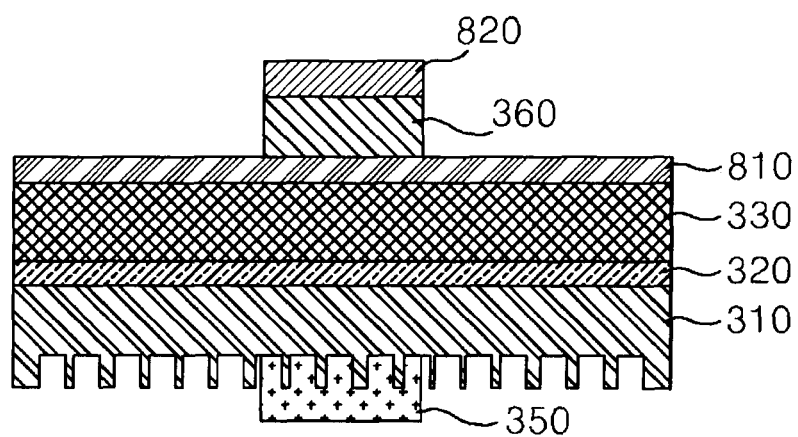
FIG. 8 is a cross-sectional view illustrating an embodiment of a light emitting device according to the present invention.

Still furthermore, the structure may be embodied in such a manner that the second electrode (360) is composed of a reflection ohmic electrode and a metal layer, where the reflection ohmic electrode (810) is formed on a top surface of the second semiconductor layer (330), and the metal layer (820) is formed thereon with a support, as illustrated in FIG. 8.

Therefore, the method for fabricating the vertical light emitting device thus configured comprises: forming a reflection ohmic electrode and a metal layer on a light emitting structure; forming a support on the metal layer; removing a substrate; and forming another electrode on a surface of the light emitting structure. Therefore, the vertical light emitting device that has gone through the fabricating processes remains with the support.

While the present invention has been particularly shown and described with reference to exemplary embodiments thereof, it will be understood by those of ordinary skill in the art that various changes in form and details may be made therein without departing from the spirit and scope of the present invention as defined by the following claims.

There is an advantage in the method of fabricating a substrate with nano structures, light emetting device and a manufacturing method thereof thus described according to the present invention in that a substrate for growing a light emitting device (LED) is formed with nano agglomerations, and the substrate is etched by using the agglomerations as a mask to allow nano structures to be formed on the substrate, thereby enabling to grow a crystal defect-reduced, reliability-improved, good quality light emitting structure, and the light emitting structure is formed with nano structures to enable to enhance the light extraction efficiency.

Another advantage is that agglomerations are formed using a simple thermal treatment process and a substrate is etched by using the agglomerations as a mask, thereby enabling to form nano structures on the substrate with ease and less cost.

What is claimed is:

1. A vertical semiconductor light emitting element comprising:
    a first semiconductor layer with a plurality of nano structures thereunder having a first polarity;
    an active layer on the first semiconductor layer;
    a second semiconductor layer on the active layer having a second polarity opposite the first polarity;
    a first electrode on some of the nano structures of the first semiconductor layer;
    a second electrode on the second semiconductor layer, the second electrode including a reflective ohmic electrode on an entire area of the second semiconductor layer, and a metal layer on a portion of the reflective ohmic electrode; and
    a support directly contacting the metal layer configured to support the metal layer, wherein a center portion of the second electrode is vertically aligned with a center portion of the first electrode.

2. The element of claim 1, wherein the first semiconductor layer includes a GaN semiconductor.

3. The element of claim 1, wherein the second semiconductor layer includes a GaN semiconductor.

4. The element of claim 1, wherein the metal layer of the second electrode is formed at a same area corresponding to that of the first electrode.

5. The element of claim 1, wherein a size of the metal layer of the second electrode corresponds to that of the first electrode.

6. The element of claim 1, wherein the nano structure includes a nano rod.

7. The element of claim 6, wherein a width of the nano rod is in the range of about 10 nm to 2,000 nm.

8. The element of claim 1, wherein the nano structure includes a nano groove.

9. The element of claim 1, wherein the nano structure includes a mixture of a nano rod and a nano groove.

10. The element of claim 1, wherein the first polarity includes an n-type.

11. The element of claim 10, wherein the second polarity includes a p-type.

12. The element of claim 1, wherein the first electrode is positioned both on some of the nano structures and a portion of the first semiconductor layer where the nano structures are not formed.

13. The element of claim 1, wherein the first electrode is positioned on the nano structures.

14. The element of claim 1, wherein the first electrode is positioned on an entire area of the first semiconductor layer.

15. The element of claim 14, wherein the first electrode is positioned on the plurality of nano structures, the nano structures comprising a plurality of nano rods, and a portion of the first semiconductor layer where the plurality of the nano rods is not formed.

16. The element of claim 1, wherein the support is positioned on an entire area of the metal layer of the second electrode.

17. The element of claim 1, wherein the support is positioned on a portion of the metal layer of the second electrode.

18. The element of claim 1, wherein the first electrode is configured to supply holes and electrons to the active layer.

19. The element of claim 1, wherein the second electrode is configured to supply holes and electrons to the active layer.

* * * * *